(12) United States Patent
Rolland et al.

(10) Patent No.: US 11,724,445 B2
(45) Date of Patent: *Aug. 15, 2023

(54) RESIN DISPENSER FOR ADDITIVE MANUFACTURING

(71) Applicant: Carbon, Inc., Redwood City, CA (US)

(72) Inventors: Jason P. Rolland, San Carlos, CA (US); Courtney F. Converse, Los Altos, CA (US); Oshin Nazarian, Glendale, CA (US); Matthew Panzer, Redwood City, CA (US)

(73) Assignee: Carbon, Inc., Redwood City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/821,555

(22) Filed: Aug. 23, 2022

(65) Prior Publication Data

US 2022/0402197 A1 Dec. 22, 2022

Related U.S. Application Data

(63) Continuation of application No. 16/616,101, filed as application No. PCT/US2018/038550 on Jun. 20, 2018, now Pat. No. 11,458,673.

(Continued)

(51) Int. Cl.
*B29C 64/124* (2017.01)
*B29C 64/314* (2017.01)
(Continued)

(52) U.S. Cl.
CPC .......... *B29C 64/124* (2017.08); *B29C 64/205* (2017.08); *B29C 64/245* (2017.08);
(Continued)

(58) Field of Classification Search
CPC ... B29C 64/124; B29C 64/205; B29C 64/245; B29C 64/255; B29C 64/314;
(Continued)

(56) References Cited

U.S. PATENT DOCUMENTS 4,173,682 A 11/1979 De et al.
5,122,441 A 6/1992 Lawton et al.
(Continued)

FOREIGN PATENT DOCUMENTS

CN 1054674 A 9/1991
CN 103571211 A 2/2014
(Continued)

OTHER PUBLICATIONS

"International Preliminary Report on Patentability for PCT/US2018/038550 dated Jan. 2, 2020, 12 pages.".

(Continued)

*Primary Examiner* — Michael M. Robinson
(74) *Attorney, Agent, or Firm* — Myers Bigel, P.A.

(57) ABSTRACT

A method of making a three-dimensional object by additive manufacturing from a blended resin including (i) at least one light polymerizable first component and, (ii) at least one, or a plurality of, second solidifiable components that are different from said first component, the method including: providing a first resin and a second resin, where the resins produce three-dimensional objects having different mechanical properties from one another when all are produced under the same process conditions; mixing the first and second resins with one another to produce the blended resin, the blended resin producing a three-dimensional object having mechanical properties intermediate between that of objects produced by the first and second resins when all are produced under the same process conditions; and dispensing the blended resin to the build region of an additive manufacturing apparatus; and then optionally but preferably producing a three-dimensional object from the blended resin in the apparatus.

20 Claims, 8 Drawing Sheets

Related U.S. Application Data

(60) Provisional application No. 62/525,364, filed on Jun. 27, 2017, provisional application No. 62/522,949, filed on Jun. 21, 2017.

(51) Int. Cl.

| | |
|---|---|
| *B29C 64/321* | (2017.01) |
| *B29C 64/364* | (2017.01) |
| *B29C 64/245* | (2017.01) |
| *B29C 64/255* | (2017.01) |
| *B29C 64/393* | (2017.01) |
| *B29C 64/35* | (2017.01) |
| *B29C 64/205* | (2017.01) |
| *B33Y 70/00* | (2020.01) |
| *B33Y 10/00* | (2015.01) |
| *B33Y 30/00* | (2015.01) |
| *B33Y 50/02* | (2015.01) |
| *B33Y 40/20* | (2020.01) |
| *B29K 63/00* | (2006.01) |
| *B29K 75/00* | (2006.01) |
| *B29K 83/00* | (2006.01) |

(52) U.S. Cl.
CPC .......... *B29C 64/255* (2017.08); *B29C 64/314* (2017.08); *B29C 64/321* (2017.08); *B29C 64/35* (2017.08); *B29C 64/364* (2017.08); *B29C 64/393* (2017.08); *B33Y 70/00* (2014.12); *B29K 2063/00* (2013.01); *B29K 2075/02* (2013.01); *B29K 2083/00* (2013.01); *B33Y 10/00* (2014.12); *B33Y 30/00* (2014.12); *B33Y 40/20* (2020.01); *B33Y 50/02* (2014.12)

(58) Field of Classification Search
CPC ..... B29C 64/321; B29C 64/35; B29C 64/364; B29C 64/393; B29K 2063/00; B29K 2075/02; B29K 2083/00; B33Y 10/00; B33Y 30/00; B33Y 40/20; B33Y 50/02
See application file for complete search history.

(56) References Cited

U.S. PATENT DOCUMENTS

| | | | |
|---|---|---|---|
| 5,236,637 A | 8/1993 | Hull | |
| 5,264,061 A | 11/1993 | Juskey et al. | |
| 5,391,072 A | 2/1995 | Lawton et al. | |
| 5,418,112 A | 5/1995 | Mirle et al. | |
| 5,629,133 A | 5/1997 | Wolf et al. | |
| 5,674,921 A | 10/1997 | Regula et al. | |
| 5,679,719 A | 10/1997 | Klemarczyk et al. | |
| 5,695,708 A | 12/1997 | Karp et al. | |
| 6,309,797 B1 | 10/2001 | Grinevich et al. | |
| 7,438,846 B2 | 10/2008 | John | |
| 7,709,544 B2 | 5/2010 | Doyle et al. | |
| 7,845,930 B2 | 12/2010 | Shkolnik et al. | |
| 7,892,474 B2 | 2/2011 | Shkolnik et al. | |
| 8,110,135 B2 | 2/2012 | El-Siblani | |
| 8,142,860 B2 | 3/2012 | Vanmaele et al. | |
| 9,205,601 B2 | 12/2015 | Desimone et al. | |
| 9,211,678 B2 | 12/2015 | Desimone et al. | |
| 9,216,546 B2 | 12/2015 | Desimone et al. | |
| 9,360,757 B2 | 6/2016 | Desimone et al. | |
| 9,453,142 B2 | 9/2016 | Rolland et al. | |
| 9,498,920 B2 | 11/2016 | Desimone et al. | |
| 9,598,606 B2 | 3/2017 | Rolland et al. | |
| 9,676,963 B2 | 6/2017 | Rolland et al. | |
| 9,708,440 B2 | 7/2017 | Das et al. | |
| 9,777,097 B2 | 10/2017 | Liu et al. | |
| 9,982,164 B2 | 5/2018 | Rolland et al. | |
| 9,993,974 B2 | 6/2018 | Desimone et al. | |
| 10,016,938 B2 | 7/2018 | Desimone et al. | |
| 10,093,064 B2 | 10/2018 | Desimone et al. | |
| 10,144,181 B2 | 12/2018 | Desimone et al. | |
| 10,150,253 B2 | 12/2018 | Desimone et al. | |
| 10,155,882 B2 | 12/2018 | Rolland et al. | |
| 10,596,755 B2 | 3/2020 | Desimone et al. | |
| 10,618,215 B2 | 4/2020 | Desimone et al. | |
| 10,975,193 B2 | 4/2021 | Cushen et al. | |
| 2003/0091833 A1 | 5/2003 | Baumgart et al. | |
| 2003/0213931 A1 | 11/2003 | Baudin et al. | |
| 2004/0014832 A1 | 1/2004 | Baudin et al. | |
| 2004/0052966 A1 | 3/2004 | Wilke et al. | |
| 2004/0135292 A1 | 7/2004 | Coats et al. | |
| 2004/0187714 A1 | 9/2004 | Napadensky et al. | |
| 2007/0178133 A1 | 8/2007 | Rolland | |
| 2007/0205528 A1 | 9/2007 | Patel et al. | |
| 2008/0131692 A1 | 6/2008 | Rolland et al. | |
| 2010/0024915 A1 | 2/2010 | Thomas et al. | |
| 2010/0105794 A1 | 4/2010 | Dietliker et al. | |
| 2011/0042859 A1 | 2/2011 | Patel et al. | |
| 2011/0089610 A1 | 4/2011 | El-Siblani et al. | |
| 2012/0007287 A1 | 1/2012 | Vermeer et al. | |
| 2012/0195994 A1 | 8/2012 | El-Siblani et al. | |
| 2012/0251841 A1 | 10/2012 | Southwell et al. | |
| 2012/0276233 A1 | 11/2012 | Napadensky | |
| 2013/0072595 A1 | 3/2013 | Yu et al. | |
| 2013/0292862 A1 | 11/2013 | Joyce | |
| 2013/0295212 A1 | 11/2013 | Chen et al. | |
| 2013/0295338 A1* | 11/2013 | Keating ............... B28B 7/346 425/375 |
| 2013/0329258 A1* | 12/2013 | Pettis ................... B29C 64/112 358/1.15 |
| 2014/0005302 A1 | 1/2014 | Briand et al. | |
| 2015/0050473 A1 | 2/2015 | Seo et al. | |
| 2015/0102532 A1 | 4/2015 | Desimone et al. | |
| 2015/0322291 A1 | 11/2015 | Salviato et al. | |
| 2015/0331402 A1 | 11/2015 | Lin et al. | |
| 2015/0360419 A1 | 12/2015 | Willis et al. | |
| 2016/0160077 A1 | 6/2016 | Rolland et al. | |
| 2016/0263838 A1 | 9/2016 | Goldman et al. | |
| 2016/0288450 A1 | 10/2016 | Schwartz et al. | |
| 2016/0298008 A1 | 10/2016 | Tasaka | |
| 2017/0021566 A1* | 1/2017 | Lund .................... B29C 64/314 |
| 2017/0113416 A1 | 4/2017 | Desimone et al. | |
| 2017/0129167 A1 | 5/2017 | Castanon | |
| 2017/0129169 A1 | 5/2017 | Batchelder et al. | |
| 2017/0151718 A1 | 6/2017 | Rolland et al. | |
| 2017/0239887 A1 | 8/2017 | Rolland et al. | |
| 2018/0015662 A1 | 1/2018 | Ermoshkin et al. | |
| 2018/0265738 A1 | 9/2018 | Rolland et al. | |
| 2019/0126547 A1 | 5/2019 | Desimone et al. | |
| 2019/0389127 A1 | 12/2019 | Desimone et al. | |
| 2020/0139617 A1 | 5/2020 | Desimone et al. | |

FOREIGN PATENT DOCUMENTS

| | | |
|---|---|---|
| EP | 0334092 A1 | 9/1989 |
| EP | 0442071 A2 | 8/1991 |
| EP | 0525578 A1 | 2/1993 |
| EP | 0562826 A1 | 9/1993 |
| EP | 0830641 A1 | 3/1998 |
| EP | 1341039 A1 | 9/2003 |
| EP | 1918316 A1 | 5/2008 |
| EP | 2224874 B1 | 1/2014 |
| EP | 2955004 A1 | 12/2015 |
| JP | H02111528 A | 4/1990 |
| JP | H09194540 A | 7/1997 |
| JP | 2000007641 A | 1/2000 |
| JP | 2015036420 A | 2/2015 |
| JP | 2015101607 A | 6/2015 |
| WO | 9207705 A1 | 5/1992 |
| WO | 9600412 A1 | 1/1996 |
| WO | 0126023 A1 | 4/2001 |
| WO | 0172501 A1 | 10/2001 |
| WO | 2006045002 A2 | 4/2006 |
| WO | 2011086450 A2 | 7/2011 |
| WO | 2014020400 A2 | 2/2014 |
| WO | 2015077419 A1 | 5/2015 |
| WO | 2016145050 A1 | 9/2016 |

(56) References Cited

FOREIGN PATENT DOCUMENTS

| WO | 2016207777 A1 | 12/2016 |
|---|---|---|
| WO | 2018237038 A1 | 12/2018 |

OTHER PUBLICATIONS

"International Search Report and Written Opinion for PCT/US2018/038550 dated Nov. 20, 2018, 18 pages.".

Dendukuri, Dhananjay, et al., "Continuous-flow lithography for high-throughput microparticle synthesis", Nature Materials, 5, 2006, 365-369.

Dendukuri, Dhananjay, et al., "Modeling of Oxygen-Inhibited Free Radical Photopolymerization in a PDMS Microfluidic Device", Macromolecules, 41, 2008, 8547-8556.

Dendukuri, Dhananjay, et al., "Stop-flow lithography in a microfluidic device", the Royal Society of Chemistry, Lab on a Chip, 7, 2007, 818-828.

Gardiner, Ginger, "Meter/mix/dispense machines: Doubling down on control", CompositesWorld, 2017, 14 pages.

Malik, Jitendra, et al., "A thermally reworkable UV curable acrylic adhesive prototype", International Journal of Adhesion & Adhesives, 22(4), 2020, 283-289.

Malik, Jitendra, et al., "Comparative Study of Novel Polymer Prototype for Controlled Thermally Reworkable UV Durable Acrylic Adhesives in Absence and Presence of Reactive Diluent", Surface Engineering, 19(2), 2003, 121-126.

Malik, Jitendra, et al., "Computational study of thermally controlled polymer network disassembly via the incorporation of sterically hindered urea linkages", Polymer, 43(8), 2002, 2561-2567.

Malik, Jitendra, et al., "The thermally controlled molecular disassembly properties of a polymer network via the incorporation of one sterically hindered urea linkage", Polymer Degradation and Stability, 76(2), 2002, 241-249.

Malik, Jitendra, et al., "Thermally Controlled Molecular Disassembly of a Crosslinked Polymer Network by the Incorporation of Sterically Hindered Urea Linkages", Journal of Applied Polymer Science, 85(4), 2002, 856-864.

Morelli, Dean, "Protest to Canadian Patent Applications by Joseph DeSimone et al.", Regarding Continuous Liquid Interphase Printing. Canadian patent applications CA2898098A1, CA 2898103A1, and CA2898106A1. Dec. 31, 2015. Canadian Intellectual Property Office, (37 pages).

Pan, Yayue, et al., "A Fast Mask Projection Stereolithography Process for Fabricating Digital Models in Minutes", J. Manufacturing Sci. and Eng. 134(5), 2012, 051011-1-9.

Park, Young-Jun, et al., "UV- and thermal-curing behaviors or dual-curable adhesives based on epoxy acrylate oligomers", International Journal of Adhesion and Adhesives, 29(7), 2009, 710-717.

Smooth-On, "Clear Flex Series—Water clear urethane rubber", Received from : https://web.archive.org/web/20150302041022/http://www.smooth-on.com:80/tb/files/CLEAR_FLEX_50_95_tTB.pdf, on Apr. 11, 2016, Apr. 11, 2016, 2 pages.

Stern, S. A., "The "Barrer" Permeability Unit", Journal of Polymer Science: Part A-2, 6(11), 1968, 1933-1934.

Tumbleston, John R., et al., "Continuous liquid interface production of 3D Objects", Science, 347(6228), 2015, 1349-1352.

Velankar, Sachin, et al., "High-Performance UV-Curable Urethane Acrylates via Deblocking Chemistry", Journal of Applied Polymer Science, 62(9), 1996, 1361-1376.

Yasuda, H., et al., "Permeability of Polymer Membranes to Dissolved Oxygen", Journal of Polymer Science, 4, 1966, 1314-1316.

\* cited by examiner

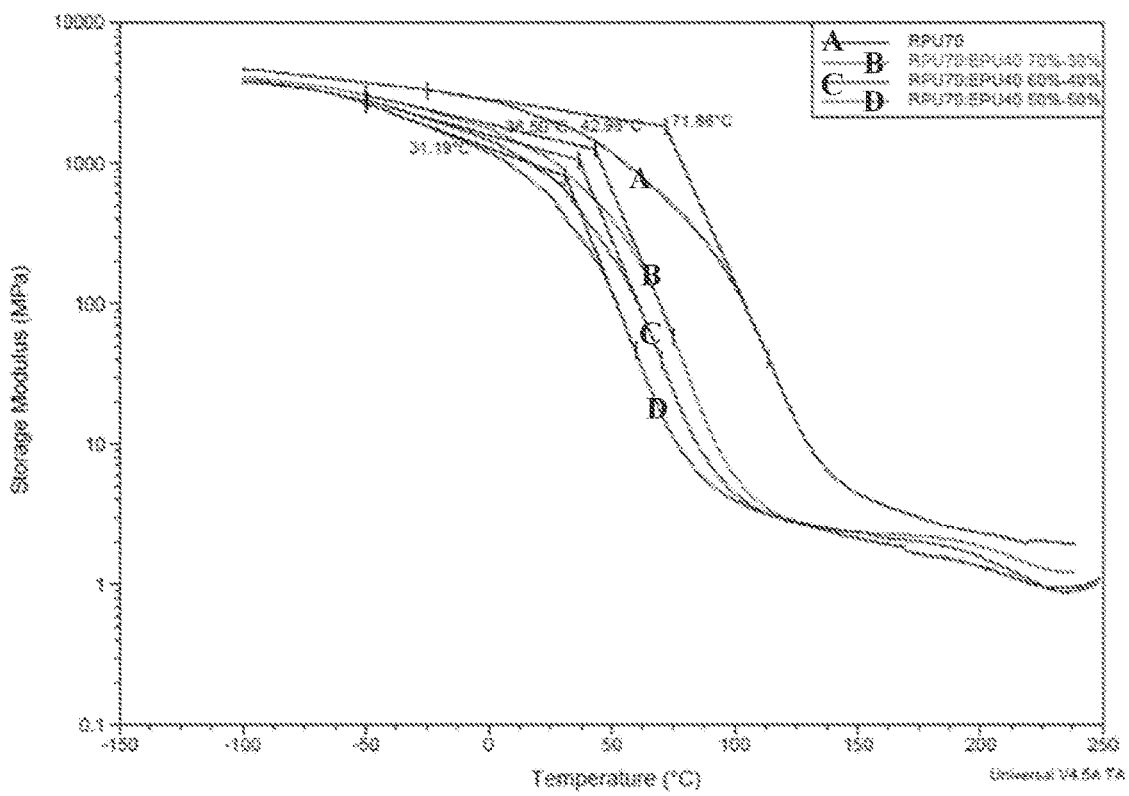
Figure 6: RPU70 + EPU40 Storage Modulus
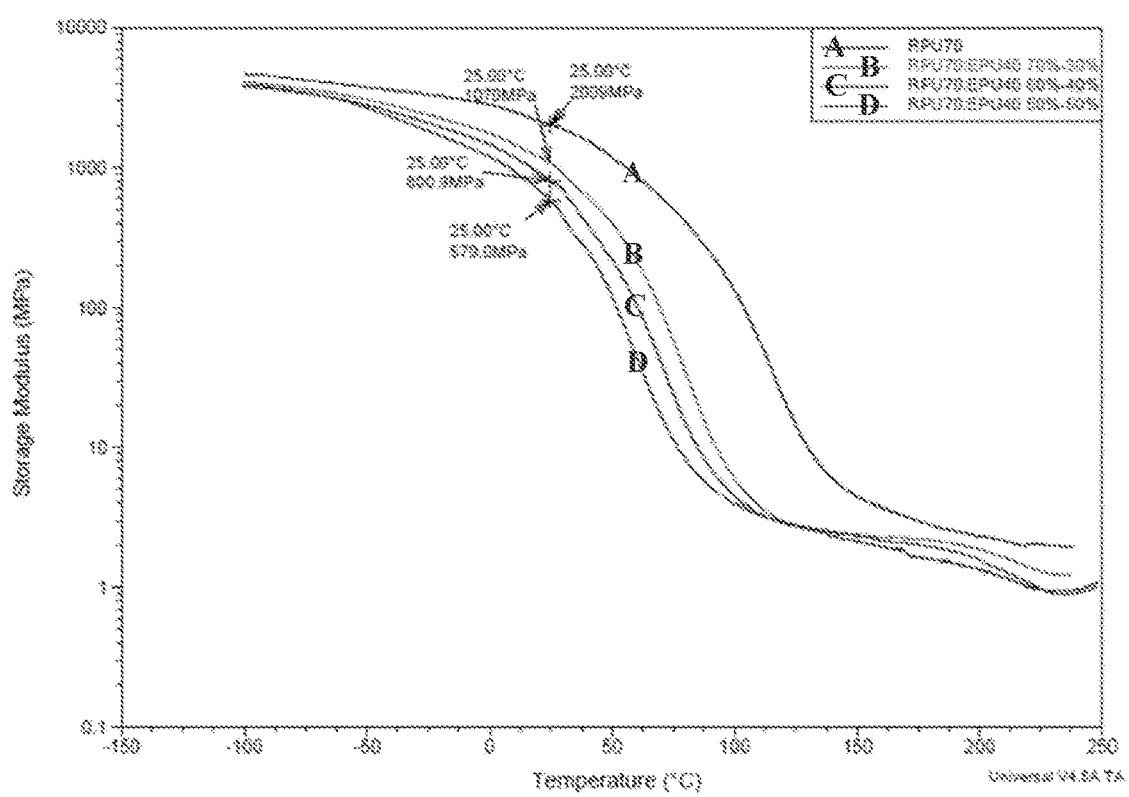
Figure 7: RPU70 + EPU40 Room Temperature Storage Modulus

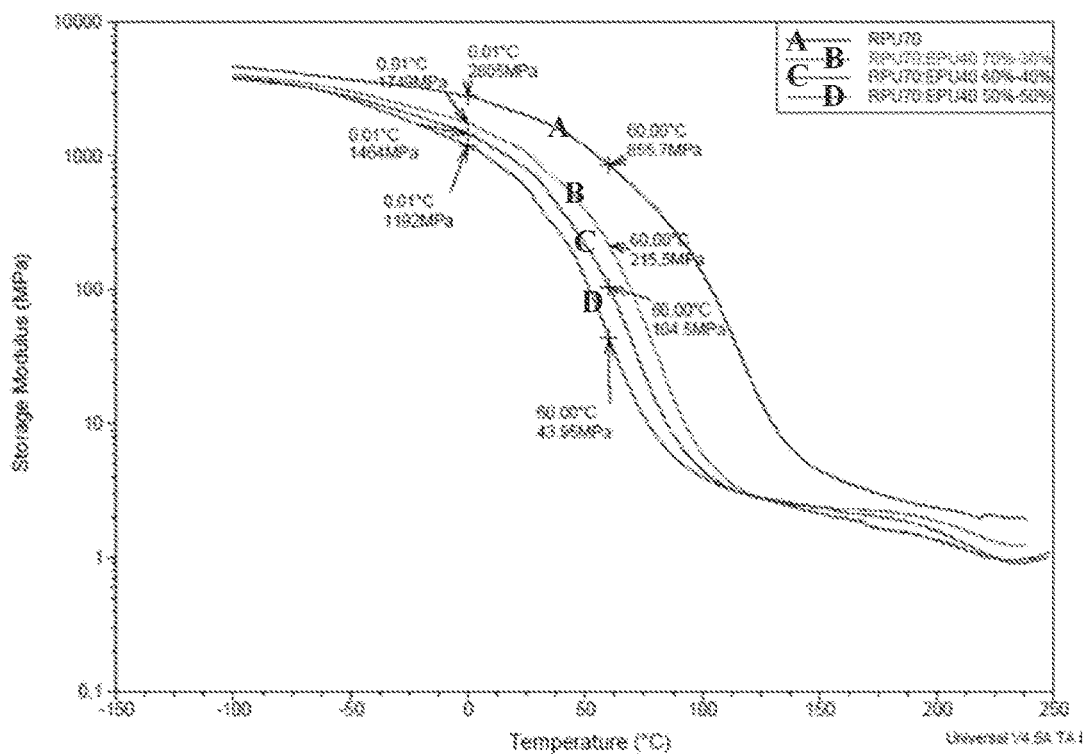
Figure 8: RPU70 + EPU40 Storage Modulus from 0°C to 60°C
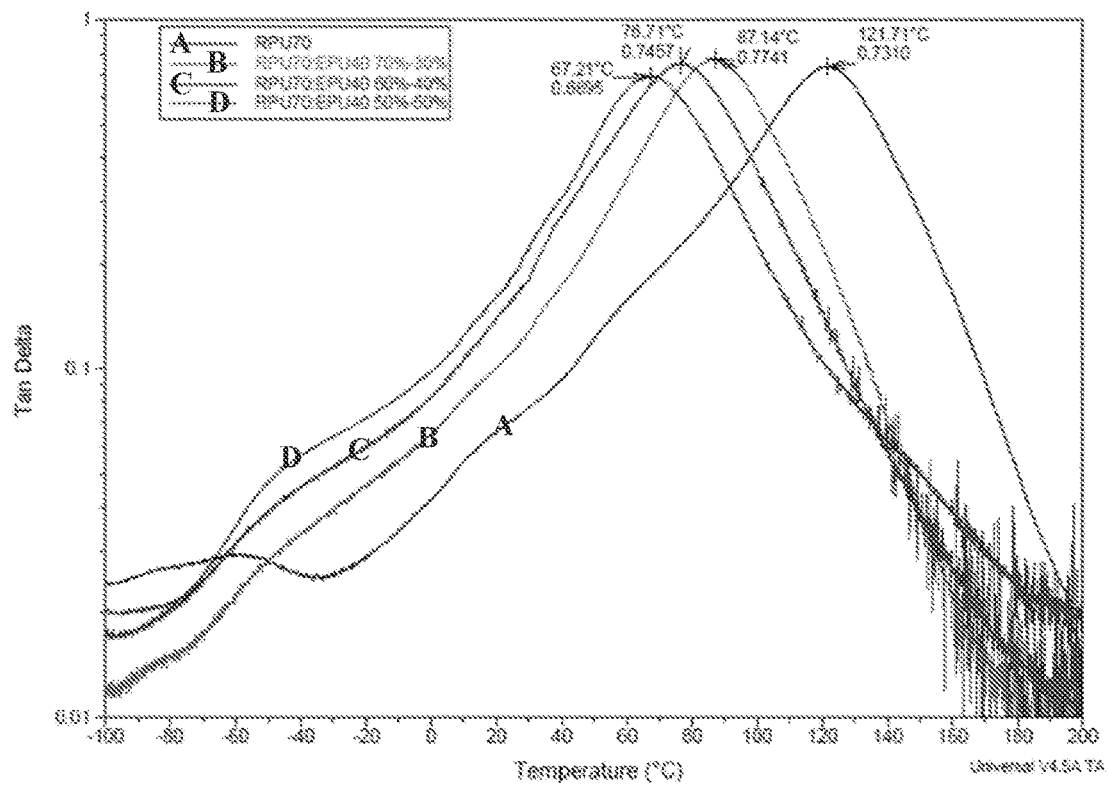
Figure 9: RPU70 + EPU40 TanD

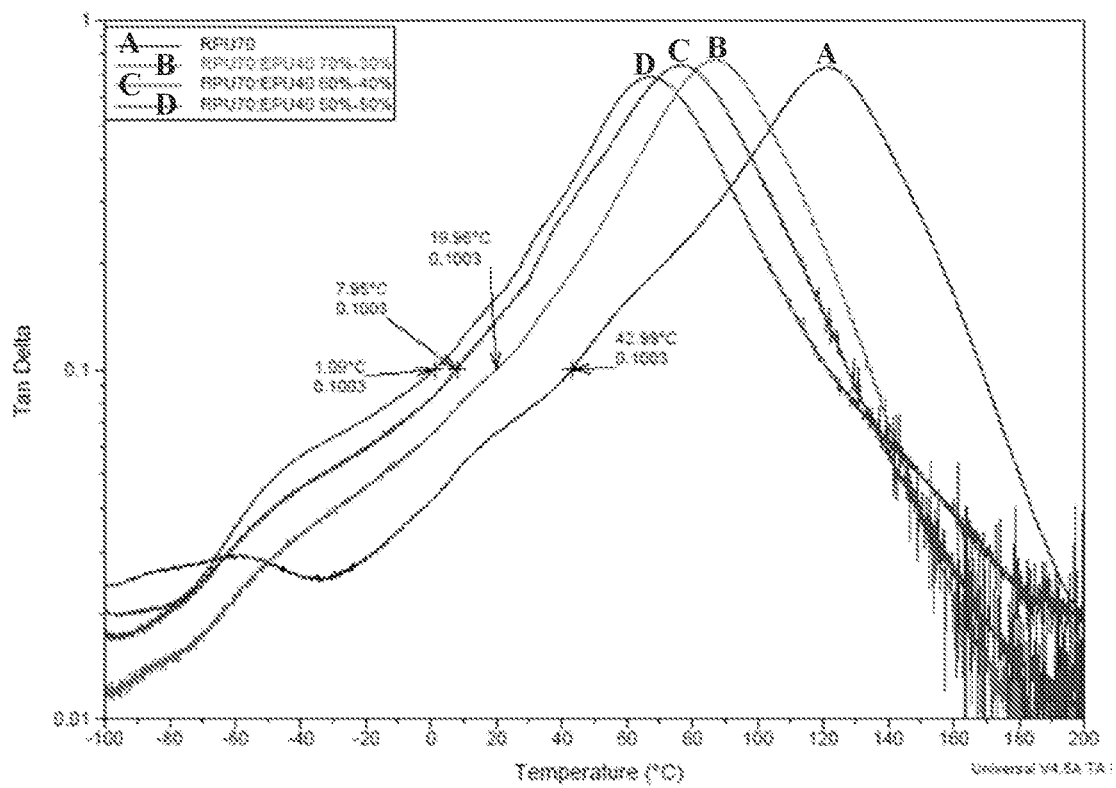
Figure 10: RPU70 + EPU40 Temperature where TanD = 0.1
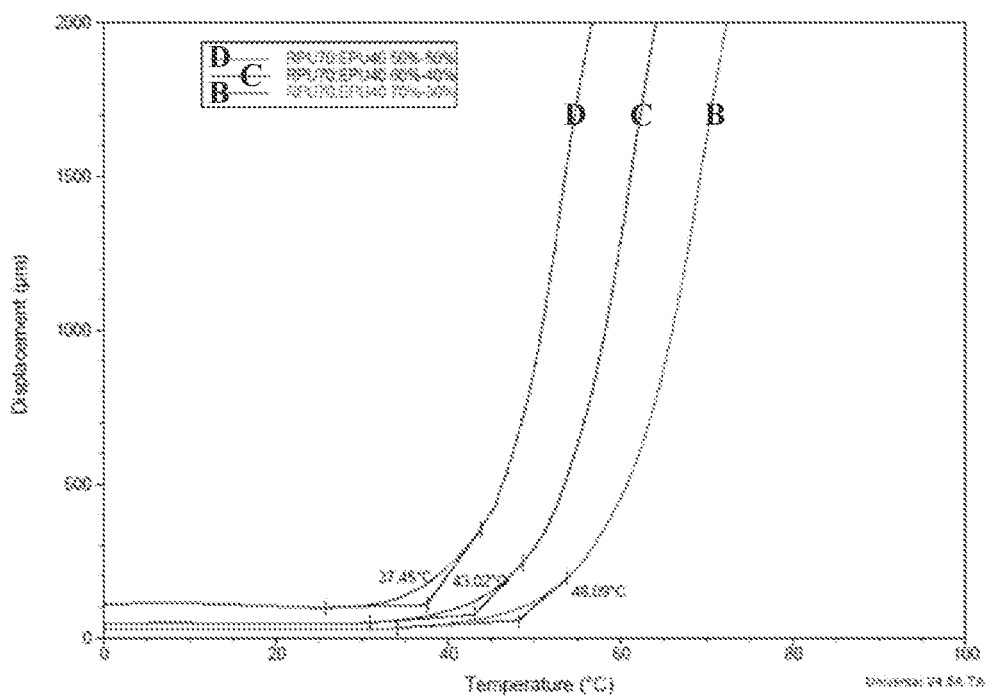
Figure 11: Heat Deflection Temperature at Operating Pressure of 100 psi

RESIN DISPENSER FOR ADDITIVE MANUFACTURING

RELATED APPLICATIONS

This is a continuation of U.S. application Ser. No. 16/616,101, filed Nov. 22, 2019, which application is a 35 U.S.C. § 371 national phase entry of International Application No. PCT/US2018/038550, filed Jun. 20, 2018, which claims priority to U.S. Provisional Application Nos. 62/522,949, filed Jun. 21, 2017, and 62/525,364, filed Jun. 27, 2017, the disclosures of which are incorporated by reference herein in their entireties.

FIELD OF THE INVENTION

The present invention concerns additive manufacturing, and particularly concerns a resin dispensing apparatus for additive manufacturing.

BACKGROUND OF THE INVENTION

Some additive manufacturing techniques, particularly bottom-up and top-down stereolithography, make a three-dimensional object by light polymerization of a resin (see, e.g., U.S. Pat. No. 5,236,637 to Hull). Unfortunately, such techniques have been generally considered slow, and have typically been limited to resins that produce brittle or fragile objects suitable only as prototypes.

A more recent technique known as continuous liquid interface production (CLIP) allows both more rapid production of objects by stereolithography (see, e.g., J. Tumbleston et al., Continuous liquid interface production of 3D Objects, Science 347, 1349-1352 (16 Mar. 2015) and U.S. Pat. Nos. 9,205,601; 9,211,678; 9,216,546; 9,360,757; and 9,498,920 to DeSimone et al.), and the production of parts with isotropic mechanical properties (see R. Janusziewcz et al., Layerless fabrication with continuous liquid interface production, *Proc. Natl. Acad. Sci. USA* 113, 11703-11708 (Oct. 18, 2016)).

Still further, the recent introduction of dual cure additive manufacturing resins by Rolland et al. (see, e.g., U.S. Pat. Nos. 9,676,963; 9,598,606; and 9,453,142), has additionally made possible the production of a much greater variety of functional, useful, objects suitable for real world use.

Together, these developments have created an increased demand for additive manufacturing resins and systems that allow for the production of objects with diverse or finely-tuned mechanical properties.

Mix meter and dispensing systems are known for purposes such as adhesive dispensing and color mixing (see, e.g., Ginger Gardiner, *Meter/mix/dispense machines: Doubling down on Control* (CompositesWorld, Feb. 3, 2014), but have not been developed for use in additive manufacturing.

SUMMARY OF THE INVENTION

Provided herein according to some embodiments is a method of making a three-dimensional object by additive manufacturing from a blended resin (e.g., a blended dual cure resin), the blended resin comprising (i) at least one light polymerizable first component and, (ii) optionally but preferably, at least one, or a plurality of, second solidifiable components that are different from said first component (e.g., that does not contain a cationic photoinitiator, or is further solidified by a different physical mechanism, or further reacted, polymerized or chain extended by a different chemical reaction), said method comprising one or more of the steps of: (a) providing a first resin and a second resin, where the resins produce three-dimensional objects having different mechanical properties from one another when all are produced under the same process conditions; (b) mixing said first and second resins with one another to produce said blended resin, the blended resin producing a three-dimensional object having mechanical properties intermediate between that of objects produced by the first and second resins when all are produced under the same process conditions; and (c) dispensing said blended resin to the build region of an additive manufacturing apparatus (e.g., a bottom-up or top-down stereolithography apparatus such as a continuous liquid interface production apparatus); and then (d) optionally but preferably producing a three-dimensional object from said blended resin in said apparatus (e.g., by bottom-up or top-down stereolithography, such as by continuous liquid interface production).

In some embodiments, the method further includes: (e) optionally washing the three-dimensional object; and (f) further curing the three-dimensional object.

In some embodiments, at least one of (e.g., both of) said first resin and said second resin is a dual cure resin provided as a pair of precursor resins, and said mixing step comprises mixing all members of each of said dual cure resins and/or pair of precursor resins with one another.

In some embodiments, (i) one member of each of said pair of precursor resins is common to both of said dual cure resins (i.e., a shared member); or (ii) each member of each of said pairs of precursor resins are different from one another.

In some embodiments, the method includes the steps of: (i) enriching said blended resin with oxygen, (ii) depleting said blended resin of nitrogen, or (iii) both enriching said blended resin with oxygen and depleting said blended resin of nitrogen.

In some embodiments, the mixing step is carried out by feeding or forcing said resins through a mixer (e.g., a static mixer or a dynamic mixer).

In some embodiments, the mixing step includes selecting a ratio at which said first and second resins are mixed together based on the mechanical properties desired in an object to be produced from said blended resin (e.g., a mass or volume ratio of from 1:100 to 100:1).

In some embodiments, the second solidifiable component is included in at least one of the resins (e.g., the precursor resins) and in said blended resin and comprises precursors to a polyurethane, polyurea, or copolymer thereof, a silicone resin, an epoxy resin, a ring-opening metathesis polymerization resin, a click chemistry resin, or a cyanate ester resin.

In some embodiments, (i) a further curing step (f) is carried out subsequent to said producing step (d) and is carried out by heating, microwave irradiating, contacting said object to water, contacting said object to a polymerization catalyst, irradiating said object with light at a different wavelength from that used in said producing step (d), or a combination thereof; or (ii) a further curing step (f) is carried out concurrently with said producing step (d) and is carried out by heating, and wherein said producing step (d) is an exothermic reaction generating heat sufficient to carry out said further curing step (f).

In some embodiments, the providing step comprises providing: (i) a first pair of precursor resins for a first dual cure resin (e.g., Precursor Resin A-1 and Precursor Resin B-1), each precursor resin in a separate container, wherein at least one light polymerizable first component is contained in one member of said pair, and at least one reactant of said second solidifiable component is contained in the other member of said pair; which pair of precursor liquids when mixed together yield a first dual cure resin that can produce by additive manufacturing an object with a first set of mechanical properties (e.g., rigid); and (ii) a second pair of precursor resins for a second dual cure resin (e.g., Precursor Resin A-2 and Precursor Resin B-2), each precursor resin in a separate container, wherein at least one light polymerizable first component is contained in one member of said pair, and at least one reactant or catalyst of said second solidifiable component is contained in the other member of said pair; which pair of precursor liquids when mixed together yield a second dual cure resin that can produce by additive manufacturing an object with a second set of mechanical properties different from that of said first set of mechanical properties (e.g., elastomeric).

In some embodiments, at least one of said first and second resins (e.g., at least one of either, or both of, said first and second) comprises a pseudoplastic composition having at least one solid particulate dispersed therein (e.g., wherein said solid particulate comprises (i) a reactive monomer or prepolymer (e.g., a polyamine), (ii) a filler (e.g., a toughener such as a core-shell rubber), or (iii) a combination thereof (e.g., wherein said solid particulate is included in said pseudoplastic composition in an amount of from 0.1, 0.2, 1, 2, 10, or 20 percent by weight, up to 40, 60, or 80 percent by weight, and/or wherein said solid particulate has an average diameter of from 1 or 2 micrometers up to 20 or 30 micrometers, or more).

In some embodiments, the object is produced by a production process based on both part configuration data (e.g., an .stl file) and blended resin data (e.g., resin type data, resin batch data, resin dispense data).

In some embodiments, the method includes recording part configuration data, object production data, and blended resin data for each object produced.

In some embodiments, the producing step (d) is blocked or paused when a pre-determined time period since mixing and dispensing of said blended resin (e.g., blended dual cure resin) has elapsed (e.g., a time period up to 1, 2 or 3 days, or up to 1 week).

Also provided herein is a dispensing apparatus for preparing a blended resin for additive manufacturing, said apparatus comprising one or more of: (a) a dispensing port configured to dispense resin to a build region of an additive manufacturing apparatus (e.g., a window cassette); (b) a mixer (e.g., a static or dynamic mixer) in fluid communication with said dispensing port; (c) at least two or three (e.g., at least four) resin feed units operatively associated with said mixer, each of said feed units configured for operative association with a separate resin supply container; (d) a controller operatively associated with each of said resin feed units, said controller configured to dispense resin from at least two or three (e.g., at least four) resin feed units through said mixer and dispensing port in a desired ratio; (e) at least one first unique identifier reader (e.g., a bar code, NFC tag, or RFID tag reader) operatively associated with said controller and configured to read a unique identifier associated with the separate resin supply containers; (f) optionally but preferably, a second unique identifier reader (e.g., a bar code, NFC tag or RFID tag reader) operatively associated with said controller and configured to read a unique identifier associated with an additive manufacturing apparatus, or a build region of an additive manufacturing apparatus (e.g., a window cassette); and (g) optionally but preferably, at least one, or a plurality of, additive manufacturing machines (e.g., a bottom-up or top-down stereolithography apparatus, such as a continuous liquid interface production apparatus) operatively associated with said controller (e.g., through a network or through the cloud).

In some embodiments, the resin feed units comprise pumps (e.g., a gear pump, peristaltic pump, or piston pump), valves, or a combination thereof.

In some embodiments, the apparatus further includes a compressed gas supply (optionally oxygen enriched and/or nitrogen depleted as compared to air) configured for operative association with each of said resin feed units (e.g., through a resin supply container coupled therebetween).

In some embodiments, the apparatus further includes a gas exchange unit (e.g., an oxygenator) operatively associated with (e.g., positioned between) said mixer and said dispensing port, said gas exchange unit configured to: (a) enrich said blended resin with oxygen, (b) deplete said blended resin of nitrogen, or (c) both enrich said blended resin with oxygen and deplete said blended resin of nitrogen.

Also provided herein is a system, comprising one or more of: (a) a dispensing apparatus as taught herein; (b) a plurality of additive manufacturing machines operatively associated with said dispensing apparatus (e.g., bottom-up or top-down stereolithography apparatus, such as continuous liquid interface production apparatus); and (c) a database operatively associated with each of said plurality of additive manufacturing machines, said database configured to record part configuration data, resin data, and blended resin data for each part produced on each additive manufacturing machine.

In some embodiments, each of said plurality of additive manufacturing machines is configured to carry out a part production process with said blended resin based on both part configuration data (e.g., an .stl file) and said blended resin data (e.g., resin type data, resin batch data, resin dispense data).

In some embodiments, the additive manufacturing machines are configured to block or pause production of a three-dimensional object from a blended resin (e.g., a blended dual cure resin), when a pre-determined time period since mixing and dispensing of said blended resin has elapsed (e.g., a time period of up to 1 or 2 days, or up to 1 week).

Further provided is a dispensing system useful for dispensing resins (e.g., dual cure resins) for additive manufacturing, comprising one or more of: (a) a dispensing apparatus comprising: (i) a dispensing port configured to dispense resin to a build region of an additive manufacturing apparatus (e.g., a window cassette); (ii) a mixer (e.g., a static or dynamic mixer) in fluid communication with said dispensing port; (iii) at least a pair of resin (e.g., precursor resin) feed units operatively associated with said mixer, each of said feed units configured for operative association with a separate precursor liquid supply container; (b) at least one, or a plurality of, additive manufacturing machine(s) (e.g., bottom-up or top-down stereolithography apparatus, such as continuous liquid interface production apparatus) operatively associated with said dispensing apparatus; said additive manufacturing machines configured to block or pause production of a three-dimensional object from a blended resin (e.g., a blended dual cure resin) when a pre-determined time period since mixing and dispensing of said blended resin has elapsed (e.g., a time period of up to 1 or 2 days, or up to 1 week).

In some embodiments, the precursor resin feed units comprise pumps (e.g., peristaltic pumps, piston pumps, gear pumps, etc.), valves, or a combination thereof.

In some embodiments, the dispensing system further includes a compressed gas supply (optionally oxygen enriched and/or nitrogen depleted as compared to air at the same temperature and pressure) configured for operative association with each of said resin feed units (e.g., through a resin supply container (e.g., a precursor resin supply container) coupled therebetween).

In some embodiments, the dispensing system further includes a gas exchange unit operatively associated with (e.g., positioned between) said mixer and said dispensing port, said gas exchange unit configured to: (a) enrich said blended resin with oxygen, (b) deplete said blended resin of nitrogen, or (c) both enrich said blended resin with oxygen and deplete said blended resin of nitrogen.

While the present invention is described herein primarily with reference to blending precursor resins to produce a blended dual cure resin, it will be appreciated that other combinations can also be implemented, including but not limited to blending a dual cure resin (one pot or pair of precursor resins) with a single cure (i.e., photopolymerizable only) resin, and even blending two single cure (i.e., photopolymerizable only) resins together.

The foregoing and other objects and aspects of the present invention are explained in greater detail in the drawings herein and the specification set forth below. The disclosures of all United States patent references cited herein are to be incorporated herein by reference.

BRIEF DESCRIPTION OF THE DRAWINGS

FIG. 6 shows the storage moduli for various blends of RPU70 and EPU40.

FIG. 7 shows room temperature storage modulus for blends of RPU70 and EPU40.

FIG. 8 shows the storage modulus for blends of RPU70 and EPU40 from 0° C. to 60° C.

FIG. 9 shows the TanD for various blends of RPU70 and EPU40.

FIG. 10 shows the upper operating temperature for various blends of RPU70 and EPU40.

FIG. 11 shows the heat deflection temperature of various blends of RPU70 and EPU40.

DETAILED DESCRIPTION OF ILLUSTRATIVE EMBODIMENTS

Figure 1:
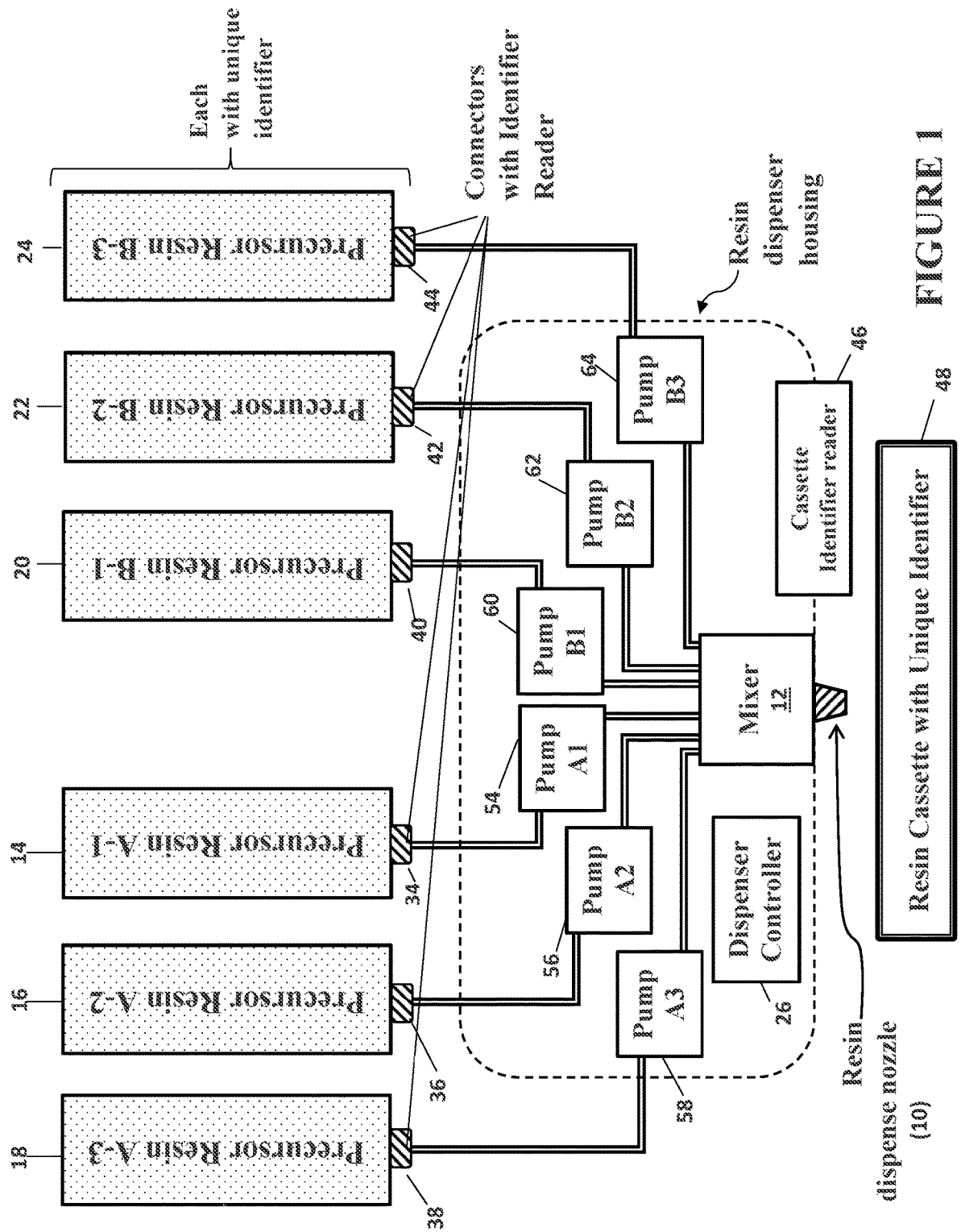
FIG. 1 is a schematic illustration of a first embodiment of an apparatus useful for carrying out the present invention.

The present invention is now described more fully hereinafter with reference to the accompanying drawings, in which embodiments of the invention are shown. This invention may, however, be embodied in many different forms and should not be construed as limited to the embodiments set forth herein; rather these embodiments are provided so that this disclosure will be thorough and complete and will fully convey the scope of the invention to those skilled in the art.

As used herein, the term "and/or" includes any and all possible combinations of one or more of the associated listed items, as well as the lack of combinations when interpreted in the alternative ("or").

"Unique identifier" and "unique identifier reader" as used herein refer to components of an automatic identification and data capture system. Suitable unique identifiers include, but are not limited to, bar codes (including one-dimensional and two-dimensional bar codes), near field communication (NFC) tags, radio frequency identification (RFID) tags (including active, passive, and battery-assisted passive RFID tags), optical character recognition (OCR) tags and readers, magnetic strips and readers, etc. A variety of such systems are known and described in, for example, U.S. Pat. Nos. 8,120,468; 8,526,910; 9,373,201; 9,562,429; 9,576,476; 9,587,487; 9,589,428; and 9,595,058. Unique identifiers and their corresponding readers of various different types can be utilized at various points in the integrated system described herein, as discussed further below. In some embodiments, RFID-based IDENTIQUICK® couplings (available from CPC, 1001 Westgate Drive, St. Paul, Minn. 55114 USA) are preferably used to identify precursor resin containers, with the couplings operatively associated with the dispenser controller as discussed below, and with an RFID tag fixed to the resin container by the resin manufacturer (or, a bar code provided on the resin container, and an RFID tag affixed to the resin container by an end user who has used a bar code reader to associate the RFID tag with a particular container of resin).

Any suitable resin container may be employed, including small containers, drums, intermediate bulk containers (IBCs or "totes"), or large containers.

1. Polymerizable Liquids (Resins).

Numerous resins for use in additive manufacturing are known and can be used in carrying out the present invention. See, e.g., U.S. Pat. No. 9,205,601 to DeSimone et al., which is incorporated by reference herein. Indeed, a feature of the present invention is to accommodate the potential use of different resins in a single additive manufacturing system. Thus, while the present invention is described herein primarily with reference to blending precursor resins to produced a blended dual cure resin, it will be appreciated that other combinations can also be implemented, including but not limited to blending a dual cure resin (one pot or pair of precursor resins) with a single cure (i.e., photopolymerizable only) resin, and even blending two single cure (i.e., photopolymerizable only) resins together. See also U.S. Pat. Nos. 9,211,678; 9,216,546; 9,360,757; and 9,498,920 to DeSimone et al., which are incorporated by reference herein.

In some embodiments, the additive manufacturing step makes use of a dual cure resin. Such resins are described in, for example, Rolland et al., U.S. Pat. Nos. 9,676,963; 9,598,606; and 9,453,142, the disclosures of which are incorporated herein by reference.

Resins may be in any suitable form, including "one pot" resins and "dual precursor" resins (where cross-reactive constituents are packaged separately, and which may be identified, for example, as an "A" precursor resin and a "B" precursor resin).

Particular examples of suitable dual cure resins include, but are not limited to, Carbon, Inc. rigid polyurethane resin (RPU), flexible polyurethane resin (FPU), elastomeric polyurethane resin (EPU), cyanate ester resin (CE), epoxy resin (EPX), or urethane methacrylate resin (UMA), all available from Carbon, Inc., 1089 Mills Way, Redwood City, Calif. 94063 USA.

Note that, in some embodiments employing "dual cure" polymerizable resins, the part, following manufacturing, may be contacted with a penetrant liquid, with the penetrant liquid carrying a further constituent of the dual cure system, such as a reactive monomer, into the part for participation in a subsequent cure. Such "partial" resins are intended to be included herein.

2. Additive Manufacturing Methods and Apparatus.

The polymerizable resins may be used for additive manufacturing, typically bottom-up or top-down additive manufacturing, generally known as stereolithography. Such methods are known and described in, for example, U.S. Pat. No. 5,236,637 to Hull, U.S. Pat. Nos. 5,391,072 and 5,529,473 to Lawton, U.S. Pat. No. 7,438,846 to John, U.S. Pat. No. 7,892,474 to Shkolnik, U.S. Pat. No. 8,110,135 to El-Siblani, US Patent Application Publication No. 2013/0292862 to Joyce, and US Patent Application Publication No. 2013/0295212 to Chen et al. The disclosures of these patents and applications are incorporated by reference herein in their entireties.

In general, top-down three-dimensional fabrication with a dual cure resin is carried out by:

(a) providing a polymerizable liquid reservoir having a polymerizable liquid fill level and a carrier positioned in the reservoir, the carrier and the fill level defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light to form a solid polymer scaffold from the first component and also advancing (typically lowering) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

A wiper blade, doctor blade, or optically transparent (rigid or flexible) window, may optionally be provided at the fill level to facilitate leveling of the polymerizable liquid, in accordance with known techniques. In the case of an optically transparent window, the window provides a build surface against which the three-dimensional intermediate is formed, analogous to the build surface in bottom-up three-dimensional fabrication as discussed below.

In general, bottom-up three-dimensional fabrication with a dual cure resin is carried out by:

(a) providing a carrier and an optically transparent member having a build surface, the carrier and the build surface defining a build region therebetween;

(b) filling the build region with a polymerizable liquid (i.e., the resin), said polymerizable liquid comprising a mixture of (i) a light (typically ultraviolet light) polymerizable liquid first component, and (ii) a second solidifiable component of the dual cure system; and then (c) irradiating the build region with light through said optically transparent member to form a solid polymer scaffold from the first component and also advancing (typically raising) the carrier away from the build surface to form a three-dimensional intermediate having the same shape as, or a shape to be imparted to, the three-dimensional object and containing said second solidifiable component (e.g., a second reactive component) carried in the scaffold in unsolidified and/or uncured form.

In some embodiments of bottom-up or top-down three-dimensional fabrication as implemented in the context of the present invention, the build surface is stationary during the formation of the three-dimensional intermediate; in other embodiments of bottom-up three-dimensional fabrication as implemented in the context of the present invention, the build surface is tilted, slid, flexed and/or peeled, and/or otherwise translocated or released from the growing three-dimensional intermediate, usually repeatedly, during formation of the three-dimensional intermediate.

In some embodiments of bottom-up or top-down three-dimensional fabrication as carried out in the context of the present invention, the polymerizable liquid (or resin) is maintained in liquid contact with both the growing three-dimensional intermediate and the build surface during both the filling and irradiating steps, during fabrication of some of, a major portion of, or all of the three-dimensional intermediate.

In some embodiments of bottom-up or top-down three-dimensional fabrication as carried out in the context of the present invention, the growing three-dimensional intermediate is fabricated in a layerless manner (e.g., through multiple exposures or "slices" of patterned actinic radiation or light) during at least a portion of the formation of the three-dimensional intermediate.

In some embodiments of bottom-up or top-down three-dimensional fabrication as carried out in the context of the present invention, the growing three-dimensional intermediate is fabricated in a layer-by-layer manner (e.g., through multiple exposures or "slices" of patterned actinic radiation or light), during at least a portion of the formation of the three-dimensional intermediate.

In some embodiments of bottom-up or top-down three-dimensional fabrication employing a rigid or flexible optically transparent window, a lubricant or immiscible liquid may be provided between the window and the polymerizable liquid (e.g., a fluorinated fluid or oil such as a perfluoropolyether oil).

From the foregoing it will be appreciated that, in some embodiments of bottom-up or top-down three-dimensional fabrication as carried out in the context of the present invention, the growing three-dimensional intermediate is fabricated in a layerless manner during the formation of at least one portion thereof, and that same growing three-dimensional intermediate is fabricated in a layer-by-layer manner during the formation of at least one other portion thereof. Thus, operating mode may be changed once, or on multiple occasions, between layerless fabrication and layer-by-layer fabrication, as desired by operating conditions such as part geometry.

In some embodiments, the intermediate is formed by continuous liquid interface production (CLIP). CLIP is known and described in, for example, U.S. Pat. Nos. 9,205,601; 9,211,678; 9,216,546; 9,360,757; and 9,498,920 to DeSimone et al. In some embodiments, CLIP employs features of a bottom-up three-dimensional fabrication as described above, but the irradiating and/or advancing steps are carried out while also concurrently maintaining a stable or persistent liquid interface between the growing object and the build surface or window, such as by: (i) continuously maintaining a dead zone of polymerizable liquid in contact with the build surface, and (ii) continuously maintaining a gradient of polymerization zone (such as an active surface)

between the dead zone and the solid polymer and in contact with each thereof, the gradient of polymerization zone comprising the first component in partially-cured form. In some embodiments of CLIP, the optically transparent member comprises a semipermeable member (e.g., a fluoropolymer), and the continuously maintaining a dead zone is carried out by feeding an inhibitor of polymerization through the optically transparent member, thereby creating a gradient of inhibitor in the dead zone and optionally in at least a portion of the gradient of polymerization zone. Other approaches for carrying out CLIP that can be used in the present invention and potentially obviate the need for a semipermeable "window" or window structure include utilizing a liquid interface comprising an immiscible liquid (see L. Robeson et al., WO 2015/164234, published Oct. 29, 2015), generating oxygen as an inhibitor by electrolysis (see I Craven et al., WO 2016/133759, published Aug. 25, 2016), and incorporating magnetically positionable particles to which the photoactivator is coupled into the polymerizable liquid (see J. Rolland, WO 2016/145182, published Sep. 15, 2016).

In some embodiments, a method of making a three-dimensional object by additive manufacturing as taught herein is performed using a blended dual cure resin. The blended dual cure resin may include a mixture of at least one light polymerizable first component and at least one, or a plurality of, second solidifiable components that are different from said first component (e.g., that does not contain a cationic photoinitiator, or is further solidified by a different physical mechanism, or further reacted, polymerized or chain extended by a different chemical reaction). The blended dual cure resin may be produced by mixing a first dual cure resin and a second dual cure resin, optionally but preferably where the respective resins would produce three-dimensional objects having different mechanical properties from one another when each are produced under the same process conditions. In some embodiments, the blended resin produces (under the same process conditions) a three-dimensional object having mechanical properties intermediate between that of objects produced by the first and second dual cure resins.

"Same process conditions" as used herein means the same object size and shape (e.g., produced from the same .stl file), the same production light intensity, speed, operating mode(s), and temperature, and the same post-processing conditions (e.g., same wash liquid, wash time, and wash cycle; same bake time, temperature, and schedule).

In some embodiments, mixing may be carried out by feeding or forcing the resins through a mixer (e.g., a static mixer or a dynamic mixer). In some embodiments, the mixing step includes selecting a ratio at which first and second dual cure resins are mixed together based on the mechanical properties desired in an object to be produced from said blended dual cure resin (e.g., a mass or volume ratio of from 1:100 to 100:1).

In some embodiments, the blended dual cure resin is dispensed to the build region of an additive manufacturing apparatus (e.g., a bottom-up or top-down stereolithography apparatus such as a continuous liquid interface production apparatus); and then optionally (but preferably) a three-dimensional object is produced from said blended dual cure resin in said apparatus (e.g., by bottom-up or top-down stereolithography, such as by continuous liquid interface production). In some embodiments, the method includes washing the three-dimensional object and/or further curing the three-dimensional object.

Further curing may be carried out subsequent to the producing step, such as by heating, microwave irradiating, contacting the object to water, contacting the object to a polymerization catalyst, irradiating the object with light at a different wavelength from that used in the producing step, or a combination thereof. Alternatively, further curing may be carried out concurrently with the producing step, such as by heating, e.g., when the producing step is an exothermic reaction that may generate heat sufficient to carry out a further curing.

Figure 2:
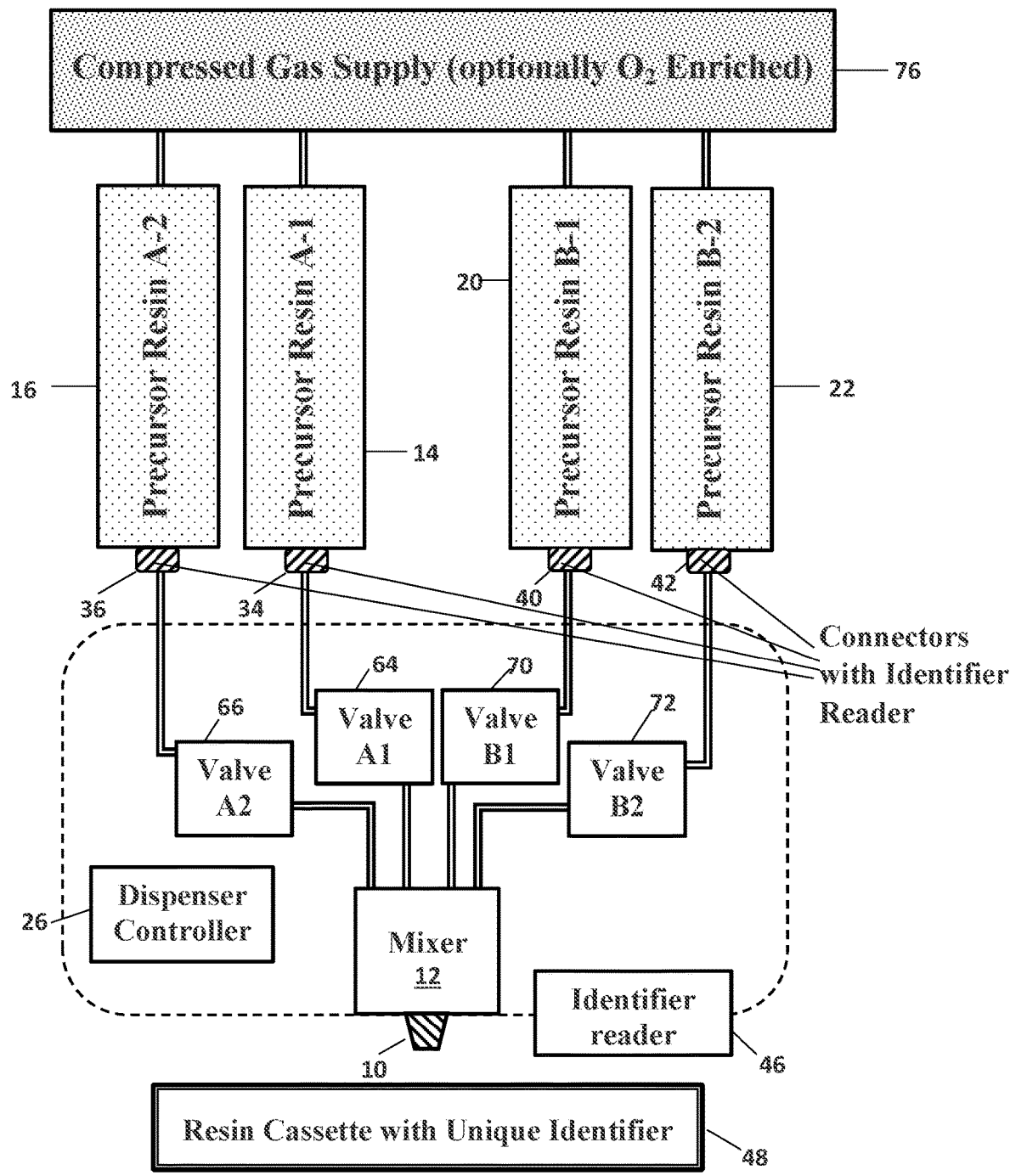
FIG. 2 is a schematic illustration of a second embodiment of an apparatus useful for carrying out the present invention, with a compressed gas feature.
Figure 3A:
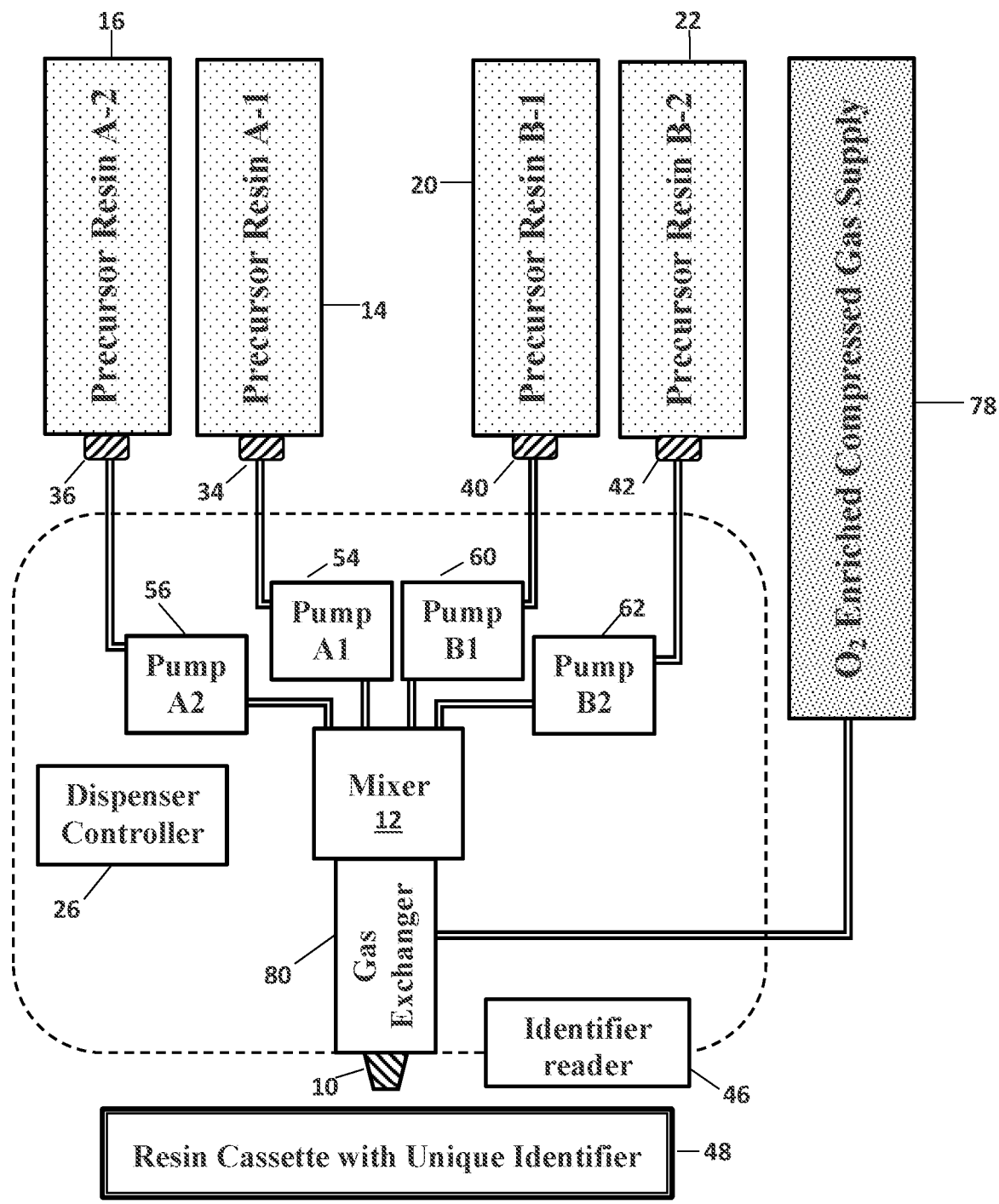
FIG. 3A is a schematic illustration of a third embodiment of an apparatus useful for carrying out the present invention, with a gas exchange feature.
Figure 3B:
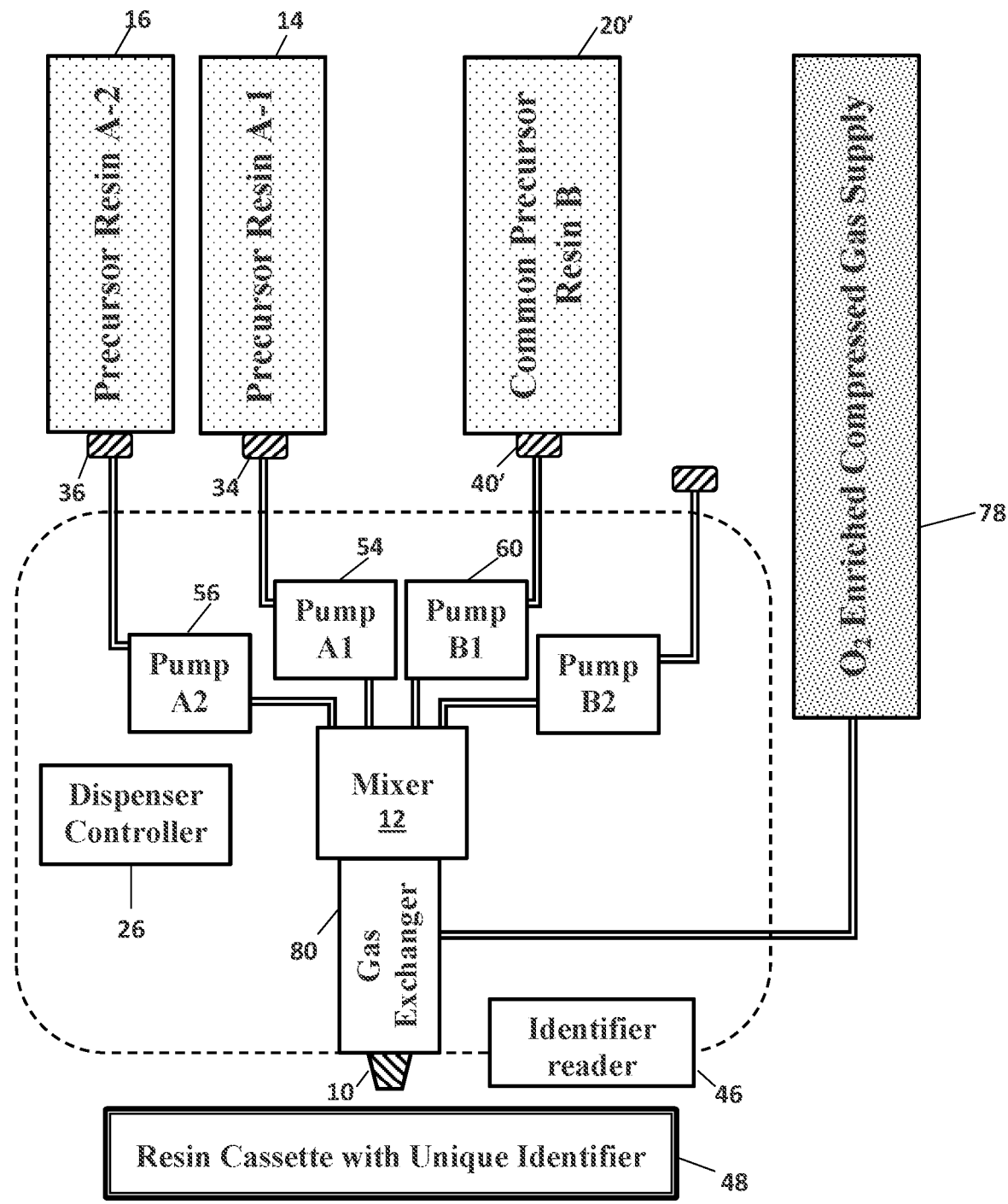
FIG. 3B is a schematic illustration of an apparatus similar to that of FIG. 3A, except that one of the precursors is shared by, or common among, multiple different precursor resin systems.

In some embodiments, at least one of (e.g., both of) said first dual cure resin and said second dual cure resin is provided as a pair of precursor resins (e.g., Precursor Resin A-1 and Precursor Resin B-1, or Precursor Resin A-2 and Precursor Resin B-2, as shown in FIGS. 1, 2, and 3A; or Precursor Resin A-1 and Precursor Resin B as shown in FIG. 3B). In some embodiments, the mixing step includes mixing all members of each of said dual cure resins and/or pair of precursor resins with one another.

As shown in FIG. 3B, one member of each pair of precursor resins may be common to both of said dual cure resins (i.e., a shared member). The common member may be provided in the same container as shown in FIG. 3B, or may be provided in separate containers.

In some embodiments, the resins, dual cure resins, precursor resins, or blended resins, may be (i) enriched with oxygen, (ii) depleted of nitrogen, or (iii) both enriched with oxygen and depleted of nitrogen.

In some embodiments, one or both of the dual cure resins comprise a second solidifiable component comprising precursors to a polyurethane, polyurea, or copolymer thereof, a silicone resin, an epoxy resin, a ring-opening metathesis polymerization resin, a click chemistry resin, or a cyanate ester resin.

In some embodiments, respective pairs of precursor resins may be provided as: (i) a first pair of precursor resins for the first dual cure resin (e.g., Precursor Resin A-1 and Precursor Resin B-1), each precursor resin in a separate container, wherein at least one light polymerizable first component is contained in one member of said pair, and at least one reactant of said second solidifiable component is contained in the other member of said pair; which pair of precursor liquids when mixed together yield a first dual cure resin that can produce by additive manufacturing an object with a first set of mechanical properties (e.g., rigid); and (ii) a second pair of precursor resins for the second dual cure resin (e.g., Precursor Resin A-2 and Precursor Resin B-2), each precursor resin in a separate container, wherein at least one light polymerizable first component is contained in one member of said pair, and at least one reactant or catalyst of said second solidifiable component is contained in the other member of said pair; which pair of precursor liquids when mixed together yield a second dual cure resin that can produce by additive manufacturing an object with a second set of mechanical properties different from that of said first set of mechanical properties (e.g., elastomeric).

In some embodiments, at least one of said first and second dual cure resins (e.g., at least one of either, or both of, said first and second precursor liquids) comprises a pseudoplastic composition having at least one solid particulate dispersed therein (e.g., wherein said solid particulate comprises (i) a reactive monomer or prepolymer (e.g., a polyamine), (ii) a filler (e.g., a toughener such as a core-shell rubber), or (iii) a combination thereof (e.g., wherein said solid particulate is included in said pseudoplastic composition in an amount of from 0.1, 0.2, 1, 2, 10, or 20 percent by weight, up to 40, 60, or 80 percent by weight, and/or wherein said solid particulate has an average diameter of from 1 or 2 micrometers up to 20 or 30 micrometers, or more).

In some embodiments, the object is produced by a production process based on both part configuration data (e.g., an .stl file) and blended resin data (e.g., resin type data, resin batch data, resin dispense data).

In some embodiments, the method includes recording part configuration data, object production data, and blended resin data for each object produced.

In some embodiments, the producing step may be blocked or paused when a pre-determined time period since mixing and dispensing of said blended resin has elapsed (e.g., a time period up to 1, 2 or 3 days, or up to 1 week).

3. Dispenser Apparatus and Systems.

Figure 4:
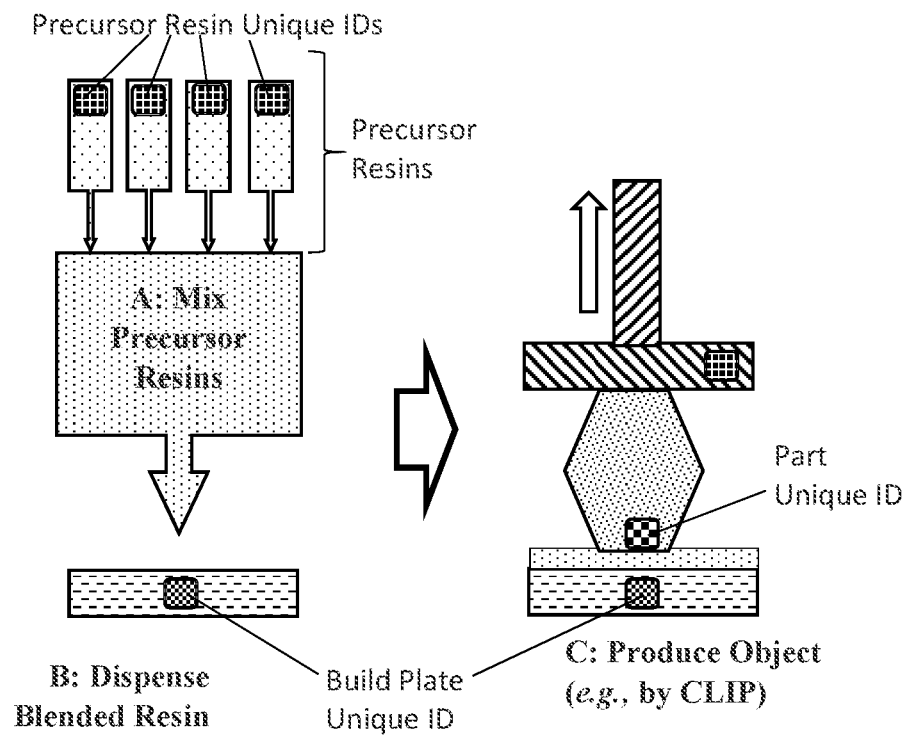
FIG. 4 schematically illustrates a method of the present invention, where resin blending is followed by additive manufacturing.
Figure 5:
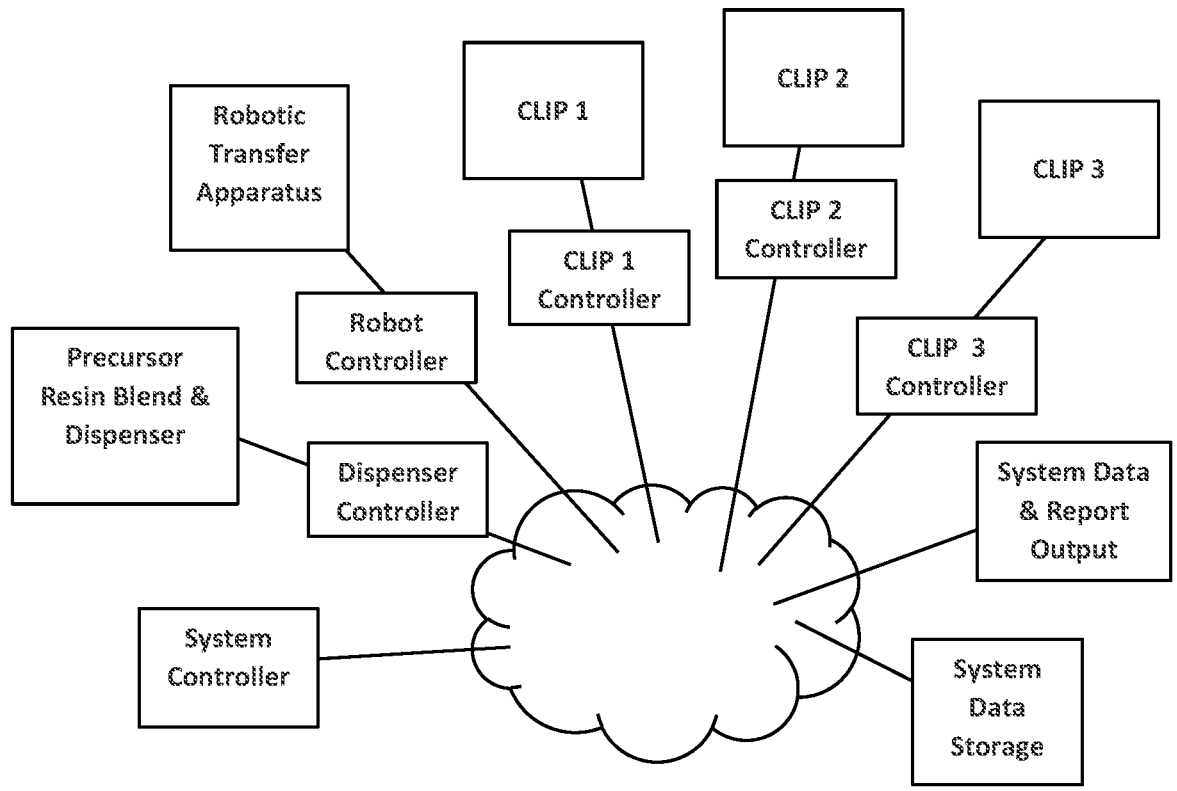
FIG. 5 schematically illustrates a system of the present invention, where a resin dispenser is operatively associated with one or more additive manufacturing apparatus (in the illustrated embodiment, a CLIP apparatus).

FIGS. 1-3 illustrate non-limiting embodiments of apparatus of the invention, FIG. 4 schematically illustrates a method of the present invention, where resin blending is followed by additive manufacturing, and FIG. 5 illustrates a non-limiting example of an apparatus of the invention combined as a system with multiple additive manufacturing apparatuses. In brief overview, FIG. 1 is a schematic illustration of a first embodiment of an apparatus 1 useful for carrying out the present invention, with pumps as the resin feed unit.

Referring to FIG. 1, the apparatus 1 may include a dispensing port or resin dispense nozzle 10 configured to dispense resin to a build region of an additive manufacturing apparatus (e.g., a window cassette). The apparatus may include a mixer 12 in fluid communication with the dispensing port 10. The apparatus may include a plurality of precursor resin feed units operatively associated with the mixer 12, with each feed unit configured for operative association with a separate precursor liquid supply container 14, 16, 18, 20, 22, 24. The apparatus may include a controller 26 operatively associated with each of the precursor resin feed units, with the controller 26 configured to dispense resin from at least two, three, or four precursor resin feed units through the mixer 12 and dispensing port 10 in a desired ratio. The apparatus may include least one first unique identifier reader (e.g., a bar code, NFC tag, or RFID tag reader) operatively associated with the controller 26 and configured to read a unique identifier 35, 37, 41, 43 associated with the separate precursor liquid supply containers (see FIG. 4). For example, the identifier readers 34, 36, 38, 40, 42, and 44 may be configured to read a unique identifier associated with the precursor liquid supply containers 14, 16, 18, 20, 22, and 24, respectively. In some embodiments, a second unique identifier reader 46 (e.g., a bar code, NFC tag or RFID tag reader) may be operatively associated with the controller 26 and configured to read a unique identifier 49 associated with an additive manufacturing apparatus, or a build region or build plate 48 of an additive manufacturing apparatus (e.g., a window cassette), as shown in FIGS. 1 and 4. In some embodiments, the precursor resin feed units comprise pumps 54, 56, 58, 60, 62, and 64 configured to pump the resin from the precursor liquid supply containers 14, 16, 18, 20, 22, and 24, respectively, to the mixer 12 (e.g., under direction of the controller 26).

FIG. 2 is a schematic illustration of an apparatus 1a similar to FIG. 1, except that valves 64, 66, 70, 72 (with an operatively associated compressed gas source 76) are used as the resin feed unit (and the compressed gas may be oxygen enriched and nitrogen depleted, as compared to air at the same temperature and pressure), to add oxygen and deplete nitrogen from the resins, as discussed further below. FIG. 3A is similar to FIG. 2, except that pumps 54, 56, 60, 62 are now implemented instead of valves for the apparatus 1b, and a compressed gas source 78 is employed for oxygen enrichment and nitrogen depletion. FIG. 3B is similar to FIG. 3A, except that one member of the resin pairs is a "common" or "shared" precursor resin (e.g., held in a precursor liquid supply container 20') for the apparatus 1c. In some embodiments, the precursor resin feed units comprise pumps (e.g., as shown in FIG. 1) (e.g., a gear pump or piston pump), valves (e.g., as shown in FIG. 2), or a combination thereof.

As illustrated in FIG. 2, FIG. 3A and FIG. 3B, the apparatus may include a compressed gas supply 76 or 78 (optionally oxygen enriched and/or nitrogen depleted as compared to air) configured for operative association with each of said precursor resin feed units (e.g., through a precursor liquid supply container coupled therebetween). In some embodiments, and as illustrated in FIG. 3A and FIG. 3B, the apparatus may include a gas exchange unit 80 (e.g., an oxygenator) operatively associated with (e.g., positioned between) said mixer 12 and said dispensing port 10, said gas exchange unit configured to: (a) enrich said blended resin with oxygen, (b) deplete said blended resin of nitrogen, or (c) both enrich said blended resin with oxygen and deplete said blended resin of nitrogen.

In some embodiments, a dispensing apparatus for preparing a blended dual cure resin for additive manufacturing may include one or more of: (a) a dispensing port (e.g., a resin dispense nozzle) configured to dispense resin to a build region of an additive manufacturing apparatus (e.g., a window cassette); (b) a mixer (e.g., a static or dynamic mixer) in fluid communication with said dispensing port; (c) at least two, three, or four precursor resin feed units operatively associated with said mixer, each of said feed units configured for operative association with a separate precursor resin supply container; (d) a controller operatively associated with each of said precursor resin feed units, said controller configured to dispense resin from at least two, three, or four precursor resin feed units through said mixer and dispensing port in a desired ratio; and (e) at least one first unique identifier reader (e.g., a bar code, NFC tag, or RFID tag reader) operatively associated with said controller and configured to read a unique identifier associated with the separate precursor liquid supply containers (see FIG. 4). In some embodiments, a second unique identifier reader (e.g., a bar code, NFC tag or RFID tag reader) may be operatively associated with said controller and configured to read a unique identifier associated with an additive manufacturing apparatus, or a build region of an additive manufacturing apparatus (e.g., a window cassette), as shown in FIG. 4. In some embodiments, at least one, or a plurality of, additive manufacturing machines 100A, 100B, 100C (e.g., a bottom-up or top-down stereolithography apparatus, such as a continuous liquid interface production apparatus) operatively associated with said controller (e.g., through a network or through the cloud), as shown in FIG. 5.

While not shown in the Figures, it will be appreciated that oxygen sensors and nitrogen sensors may be included in the apparatus, preferably downstream of the mixer or any gas exchange, to detect oxygen and/or nitrogen levels (e.g., following enrichment or depletion, respectively), which may then be recorded and optionally utilized to modify or control the additive manufacturing process itself.

4. Integrated Systems.

FIG. 4 schematically illustrates one embodiment of an integrated method of the present invention, where resin blending is followed by an additive manufacturing step, and FIG. 5 illustrates a "cloud" or internet-based system for carrying out such a method (although other methods of forming a system, such as local area networks, may also be used, as discussed in "system architecture" below).

Integrated systems according to some embodiments may include one or more of: (a) a dispensing apparatus as taught herein; (b) a plurality of additive manufacturing machines operatively associated with said dispensing apparatus (e.g., bottom-up or top-down stereolithography apparatus, such as continuous liquid interface production apparatus); and (c) a database operatively associated with each of said plurality of additive manufacturing machines, said database configured to record part configuration data, precursor resin data, and blended resin data for each part produced on each additive manufacturing machine.

In some embodiments, each of said plurality of additive manufacturing machines is configured to carry out a part production process with said blended resin based on both part configuration data (e.g., an .stl file) and said blended resin data (e.g., resin type data, resin batch data, resin dispense data).

In some embodiments, the additive manufacturing machines are configured to block or pause production of a three-dimensional object from a blended resin (e.g., blended dual cure resin), when a pre-determined time period since mixing and dispensing of said blended resin has elapsed (e.g., a time period of up to 1 or 2 days, or up to 1 week).

In some embodiments, the dispensing system may include one or more of: (a) a dispensing apparatus comprising: (i) a dispensing port configured to dispense resin to a build region of an additive manufacturing apparatus (e.g., a window cassette); (ii) a mixer (e.g., a static or dynamic mixer) in fluid communication with said dispensing port; (iii) at least a pair of precursor resin feed units operatively associated with said mixer, each said feed unit configured for operative association with a separate precursor liquid supply container; (b) at least one, or a plurality of, additive manufacturing machine(s) (e.g., bottom-up or top-down stereolithography apparatus, such as continuous liquid interface production apparatus) operatively associated with said dispensing apparatus; said additive manufacturing machines configured to block or pause production of a three-dimensional object from a blended dual cure resin when a pre-determined time period since mixing and dispensing of said blended dual cure resin has elapsed (e.g., a time period of up to 1 or 2 days, or up to 1 week).

In some embodiments, the precursor resin feed units comprise pumps (e.g., piston pumps, gear pumps, etc.), valves, or a combination thereof.

In some embodiments, the dispensing system further includes a compressed gas supply (optionally oxygen enriched and/or nitrogen depleted as compared to air at the same temperature and pressure) configured for operative association with each of said precursor resin feed units (e.g., through a precursor liquid supply container coupled therebetween).

In some embodiments, the dispensing system further includes a gas exchange unit operatively associated with (e.g., positioned between) said mixer and said dispensing port, said gas exchange unit configured to: (a) enrich said blended resin with oxygen, (b) deplete said blended resin of nitrogen, or (c) both enrich said blended resin with oxygen and deplete said blended resin of nitrogen.

Note that a single additive manufacturing apparatus, or a plurality of such additive manufacturing machines, may be operatively associated with a single dispenser, as also discussed in "system architecture" below).

In addition, while the dispenser and the additive manufacturing machine(s) are illustrated as separate items of equipment, with a "window cassette" being used to transfer resin from one to the other, it will be appreciated that the dispensing assembly can be combined with the additive manufacturing machine as a single integrated piece of equipment.

It will be appreciated that different unique identifiers can be used at different points in the systems and methods described herein. For example, an NFC tag, RFID tag, or bar code may be most appropriate for placing on or associating with the resin container when the resin is manufactured, with the associated reader operatively associated with a resin dispenser or supply system into which the resin will be loaded by the resin user. The resin manufacturer can optionally utilize an associated reader, when the resin is manufactured, to enter into the database the resin type, batch ingredient data, and/or manufacturer identity (see, for example, Tables 1A-1B).

TABLE 1A

| RESIN TYPE DATA. | |
| --- | --- |
| 1 | RIGID POLYURETHANE |
| 2 | FLEXIBLE POLYURETHANE |
| 3 | ELASTOMERIC POLYURETHANE |
| 4 | CYANATE ESTER |
| 5 | EPOXY |
| 6 | SILICONE |
| 7 | URETHANE METHACRYLATE |
| 8 | [OTHER] |

TABLE 1B

| RESIN BATCH DATA. | |
| --- | --- |
| 1 | DATE OF MANUFACTURE |
| 2 | INGREDIENT DATA (e.g., QC DATA) |
| 3 | MANUFACTURER IDENTITY |

Similarly, where mixed or blended resin is dispensed into a movable build plate (sometimes also referred to as a "window" or a "cassette") that is then transferred with the resin to an additive manufacturing machine, then an NFC tag, RFID tag, or bar code might be most appropriate to associate with that build plate or cassette, with the associated reader at the resin dispenser and/or at the additive manufacturing machine configured to capture the build plate identity, and associate it with the resin data, in the database. Non-limiting examples of resin dispense data include that set forth in Table 1C. Thus "specific resin data" may include, for example, resin type data and resin batch data (non-limiting examples of which are given in Tables 1A-1B), optionally supplemented with resin dispense data (non-limiting examples of which are given in Table 1C).

TABLE 1C

| RESIN DISPENSE DATA. | |
| --- | --- |
| 1 | DATE AND TIME OF DISPENSE |
| 2 | DISPENSE SPEED |
| 3 | DISPENSE VOLUME |
| 4 | CASSETTE ID |
| 5 | PRECURSOR RESIN MIX RATIO |
| 6 | OXYGEN CONTENT |
| 7 | NITROGEN CONTENT |

When parts or objects are additively manufactured on a removable build plate, the build plate may have its own appropriate unique identifier, such as an NFC tag, RFID tag, or bar code, with appropriate reader on the additive manufacturing machine, to record additive production data (see, for example, Table 2).

TABLE 2

ADDITIVE PRODUCTION DATA.

| | |
|---|---|
| 1 | OBJECT DATA INPUT (e.g., .stl file) |
| 2 | DURATION |
| 3 | EXPOSURE INTENSITY |
| 4 | OPERATING MODE(S): Continuous, stepped, reciprocal, combination, etc. |
| 5 | MACHINE IDENTITY |
| 6 | TIME AND DAY OF PRODUCTION |
| 7 | BUILD PLATE IDENTITY (WINDOW) |
| 8 | BUILD PLATE USE HISTORY |
| 9 | OPERATOR IDENTITY |

Each part produced on an additive manufacturing machine can also have its own unique identifier (for example, a set of alphanumeric characters appearing on a surface thereof), which can be imparted by any suitable technique, including in the apparatus controller a routine for modifying each product geometry data file just before part production, and recording the unique identifier in association with that part (along with other resin and part production data).

System architecture. A non-limiting example of a system architecture for the present invention is given in FIG. 5. Nevertheless, it will be appreciated that any of a variety of different architectures can be employed. Controllers can be a general purpose computer dedicated to, or on board, a particular apparatus (e.g., running software programs such as timers to block or pause production on an additive manufacturing apparatus after a predetermined time has elapsed following mixing and dispensing of a particular blended resin, for example as detected through a unique identifier on the window cassette onto which a particular resin has been dispensed); a local general purpose computer operatively associated with a group of machines via a local area network (or metropolitan area network); a remote general purpose computer operatively associated with machines via a wide area network or internet connection (see, for example, FIG. 5); and combinations thereof (for example, organized in a client-server architecture and/or distributed architecture). Likewise, data storage or memory can be on separate (volatile and/or non-volatile) memory devices located locally or remotely, partitioned sections of a single memory device, etc., including combinations thereof (e.g., a remote back-up memory in addition to a local memory). Peripheral devices for data entry and display can be implemented in any of a variety of ways known in the art, including typical keypad entry, video display, and printing apparatus, as well as graphical user interfaces such as touch-pads, touch-screens and the like, including smartphone touch screens.

Following additive manufacturing, the objects may be washed, further modified, and further cured, in any suitable order, as discussed in, for example, Rolland et al., U.S. Pat. Nos. 9,676,963; 9,598,606; and 9,453,142.

Some aspects of the present invention are explained in greater detail in the following non-limiting Examples.

EXAMPLES 1-6

As discussed below, it was found that, by simply blending two different dual cure resins—for example, one for a rigid polyurethane product, and one for an elastomeric polyurethane product, with both provided in the form of dual precursor resins—parts can be created with mechanical properties intermediate between the two, and with adequate toughness and durometer scores.

Results of Dynamic Mechanical Analysis (DMA) discussed below gives insight into the glass transition temperature (Tg), heat deflection temperature (HDT), and susceptibility to creep (TanD) across a temperature range of −100° C. to 200° C., for three different blends, and shows that two different resin systems (RPU70 and EPU40, available from Carbon Inc., 1028 Mills Way, Redwood City, Calif. 94063 USA) can be used to conveniently generate a range of different product properties.

Example 1

RPU70+EPU40 Storage Modulus

FIG. 6 shows the storage moduli for various blends of RPU70 and EPU40. As can be seen, the onset of glass transition for neat RPU70 is 72° C. Further, upon blending EPU40 with RPU70 in 30%, 40%, and 50% ratios (by mass), the glass transition temperature was progressively lowered to 43° C., 37° C., and 31° C. respectively.

Example 2

RPU70+EPU40 Room Temperature Storage Modulus

Upon considering the room temperature storage modulus as shown in FIG. 7, a substantial change in stiffness was seen. From neat RPU70 to a RPU70-EPU40 70%-30% mixture, a drop by half is seen. Further, a drop by roughly 200 MPa for each 10% increase in EPU40 is seen.

Example 3

RPU70+EPU40 Storage Modulus from 0° C. to 60° C.

Upon considering a temperature use range of 0° C. to 60° C. as shown in FIG. 8, a substantial drop in stiffness is seen. In fact, 60° C. is considerably higher than the onset temperature from the storage modulus, therefore the storage modulus is substantially masked by the loss modulus.

Example 4

RPU70+EPU40 TanD

Because the onset temperatures of the RPU70:EPU40 blends fall within the reasonable operating temperature range of 0° C.-60° C., the TanD must be considered. TanD is of particular interest when the blends are considered for a load bearing application of 100 psi (0.6895 MPa). FIG. 9 shows the peak of the TanD glass transition, which is the temperature at which the dissipative to elastic character is at its highest. With that said, although glass transitions for these materials are broad, a decrease in peak glass transitions was seen from 121° C., for neat RPU70, to 87° C., 77° C., and 67° C., for 30%, 40%, and 50% EPU40 mixtures, respectively. Lastly, an increase in the noise of measurement is seen for the RPU70:EPU40 blends as 150° C. is transcended. This noise may be due to loss of monomer or decomposition of the materials.

Example 5

RPU70+EPU40 Temperature where TanD=0.1

As a general rule in applying polymers for load bearing applications, it is preferable to keep the elastic character much greater than the loss character (tanD<<1). Usually, polymers will be applied in a temperature window where the storage modulus is over 100 times greater than the loss modulus (tanD~0.01). When the elastic character of a polymer dominates, the resistance of a polymer to flow will be at its highest. Thus creep is a concern as tanD increases. Michael Sepe, *Dynamic Mechanical Analysis for Plastics Engineering* (PDL Handbook Series, $1^{st}$ ed. 1998), states that thermoplastics should never be applied in a load bearing application where the elastic character is only 10 times greater than the loss character (tanD=0.1).

FIG. 10 shows the upper operating temperature for a load bearing application (tanD=0.1). As can be seen, neat RPU70 is not ideal for load bearing applications above 43° C. Further, the upper recommended temperature for the 70%-30% blend is just below room temperature (20° C.). Lastly, the 60%-40% and 50%-50% blend have upper temperature limit at 8° C. and 1° C. respectively. Based on the tanD=0.1 general rule, one would not recommend using any of these materials for a 100 psi pressure application where dimensional accuracy is needed over long periods of time.

Example 6

Heat Deflection Temperature at Operating Pressure of 100 Psi

When considering the RPU70:EPU40 blends at 100 psi, the deflection of materials across various temperatures for that pressure should also be considered. The deflection, or displacement, will also yield insight into the materials' ability to maintain a necessary tolerance in the operating temperature range for 100 psi. Note, this test does not consider creep on any relevant time scale beyond instantaneous pressure loading over a temperature ramp of 2° C./min. The ASTM D648 ramp rate is fast for this geometry (2 mm thick); therefore temperature gradients will artificially inflate our onset temperature. In all, this test provides a good comparison between these blends.

As can be seen in FIG. 11, the onset of deflection occurs at 37° C., 43° C., and 48° C. for 50%, 40%, and 30% EPU40 loadings respectively. Under a pressure of 100 psi, we generally reach displacements up to 1 mm at 60° C.

The foregoing is illustrative of the present invention, and is not to be construed as limiting thereof. The invention is defined by the following claims, with equivalents of the claims to be included therein.

We claim:

1. A method of making a three-dimensional object by additive manufacturing from a blended resin, the blended resin comprising (i) at least one light polymerizable first component and, (ii) at least one, or a plurality of, second solidifiable components that are different from said first component, said method comprising:
   (a) providing a first resin and a second resin, where the resins produce three-dimensional objects having different mechanical properties from one another when all are produced under the same process conditions;
   (b) mixing said first and second resins with one another to produce said blended resin, the blended resin producing a three-dimensional object having mechanical properties intermediate between that of objects produced by the first and second resins when all are produced under the same process conditions; and
   (c) dispensing said blended resin to a build region of an additive manufacturing apparatus, said apparatus comprising a carrier and an optically transparent member having a build surface, with the carrier and the build surface defining said build region therebetween; and then
   (d) producing a three-dimensional intermediate by irradiating said blended resin in said apparatus with light having a first wavelength through said optically transparent member to form a solid polymer scaffold from said first component and also advancing said carrier away from said build surface to form said three-dimensional intermediate having the same shape as, or a shape to be imparted to, said three-dimensional object and containing said at least one second solidifiable component carried in said scaffold in unsolidified and/or uncured form;
   (e) optionally washing said three-dimensional intermediate; and
   (f) further curing said at least one second solidifiable component in said three-dimensional intermediate to form said three-dimensional object.

2. The method of claim 1, wherein at least one of said first resin and said second resin is a dual cure resin provided as a pair of precursor resins, and said mixing step comprises mixing all members of each of said dual cure resins and/or pair of precursor resins with one another.

3. The method of claim 2, wherein:
   (i) one member of each of said pair of precursor resins is common to both of said dual cure resins; or
   (ii) each member of each of said pairs of precursor resins are different from one another.

4. The method of claim 1, wherein said mixing step is carried out by feeding or forcing said resins through a mixer.

5. The method of claim 1, wherein said mixing step includes selecting a ratio at which said first and second resins are mixed together based on the mechanical properties desired in an object to be produced from said blended resin.

6. The method of claim 1, wherein said second solidifiable component is included in at least one of said resins and in said blended resin and comprises precursors to a polyurethane, polyurea, or copolymer thereof, a silicone resin, an epoxy resin, a ring-opening metathesis polymerization resin, a click chemistry resin, or a cyanate ester resin.

7. The method of claim 1, wherein:
   (i) said further curing step (f) is carried out subsequent to said producing step (d) and is carried out by heating, microwave irradiating, contacting said object to water, contacting said object to a polymerization catalyst, irradiating said object with light having a second wavelength different from the first wavelength used in said producing step (d), or a combination thereof; or
   (ii) said further curing step (f) is carried out concurrently with said producing step (d) and is carried out by heating, and wherein said producing step (d) is an exothermic reaction generating heat sufficient to carry out said further curing step (f).

8. The method of claim 1, wherein said providing step comprises providing:
   (i) a first pair of precursor resins for a first dual cure resin, each precursor resin in a separate container, wherein at least one light polymerizable first component is contained in one member of said pair, and at least one reactant of said second solidifiable component is contained in the other member of said pair; which pair of precursor liquids when mixed together yield a first dual cure resin that can produce by additive manufacturing an object with a first set of mechanical properties; and
   (ii) a second pair of precursor resins for a second dual cure resin, each precursor resin in a separate container, wherein at least one light polymerizable first component is contained in one member of said pair, and at least one reactant or catalyst of said second solidifiable component is contained in the other member of said pair; which pair of precursor liquids when mixed together yield a second dual cure resin that can produce by additive manufacturing an object with a second set of mechanical properties different from that of said first set of mechanical properties.

9. The method of claim 1, wherein at least one of said first and second resins comprises (i) a pseudoplastic composition having at least one solid particulate dispersed therein, (ii) a filler, or (iii) a combination thereof.

10. The method of claim 1, wherein said object is produced by a production process based on both part configuration data and blended resin data.

11. The method of claim 1, further comprising recording part configuration data, object production data, and blended resin data for each object produced.

12. The method of claim 1, wherein said producing step (d) is blocked or paused when a pre-determined time period since mixing and dispensing of said blended resin.

13. A method of making a three-dimensional object by additive manufacturing from a blended resin, the blended resin comprising (i) at least one light polymerizable first component and, (ii) optionally at least one, or a plurality of, second solidifiable components that are different from said first component, said method comprising:
(a) providing a first resin and a second resin, where the resins produce three-dimensional objects having different mechanical properties from one another when all are produced under the same process conditions;
(b) mixing said first and second resins with one another to produce said blended resin, the blended resin producing a three-dimensional object having mechanical properties intermediate between that of objects produced by the first and second resins when all are produced under the same process conditions; and
(c) dispensing said blended resin to a build region of an additive manufacturing apparatus; and then
(d) optionally but preferably producing a three-dimensional object from said blended resin in said apparatus, the method further comprising the steps of: (i) enriching said blended resin with oxygen, (ii) depleting said blended resin of nitrogen, or (iii) both enriching said blended resin with oxygen and depleting said blended resin of nitrogen.

14. The method of claim 13, further comprising:
(e) optionally washing said three-dimensional object; and
(f) further curing said three-dimensional object.

15. A dispensing apparatus for preparing a blended resin for additive manufacturing, said apparatus comprising:
(a) a dispensing port configured to dispense resin to a build region of an additive manufacturing apparatus;
(b) a mixer in fluid communication with said dispensing port;
(c) at least two or three resin feed units operatively associated with said mixer, each of said feed units configured for operative association with a separate resin supply container;
(d) a controller operatively associated with each of said resin feed units, said controller configured to dispense resin from at least two or three resin feed units through said mixer and dispensing port in a desired ratio;
(e) at least one first unique identifier reader operatively associated with said controller and configured to read a unique identifier associated with the separate resin supply containers;
(f) a second unique identifier reader operatively associated with said controller and configured to read a unique identifier associated with an additive manufacturing apparatus, or a build region of an additive manufacturing apparatus; and
(g) at least one, or a plurality of, additive manufacturing machines operatively associated with said controller.

16. The apparatus of claim 15, wherein said mixer comprises a static or dynamic mixer.

17. The apparatus of claim 15, wherein said at least two or three resin feed units comprises at least four precursor resin feed units.

18. The apparatus of claim 15, wherein said resin feed units comprise pumps, valves, or a combination thereof.

19. The apparatus of claim 15, further comprising a compressed gas supply configured for operative association with each of said resin feed units.

20. The apparatus of claim 15, further comprising a gas exchange unit operatively associated with said mixer and said dispensing port, said gas exchange unit configured to: (a) enrich said blended resin with oxygen, (b) deplete said blended resin of nitrogen, or (c) both enrich said blended resin with oxygen and deplete said blended resin of nitrogen.

* * * * *